(12) United States Patent
Hsu

(10) Patent No.: US 6,613,626 B1
(45) Date of Patent: Sep. 2, 2003

(54) METHOD OF FORMING CMOS TRANSISTOR HAVING A DEEP SUB-MICRON MID-GAP METAL GATE

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 137 days.

(21) Appl. No.: 09/604,136

(22) Filed: Jun. 27, 2000

(51) Int. Cl.[7] .................. H01L 21/8234; H01L 21/20; H01L 21/36; H01L 21/22; H01L 21/38

(52) U.S. Cl. .................. 438/217; 438/489; 438/558; 438/223; 438/224; 438/227; 438/199; 257/369

(58) Field of Search .................. 438/489, 558, 438/223, 224, 199, 227, 217; 257/369

(56) References Cited

U.S. PATENT DOCUMENTS

| | | | | |
|---|---|---|---|---|
| 4,777,147 A | * | 10/1988 | Scott et al. .................. | 438/153 |
| 4,966,861 A | * | 10/1990 | Mieno et al. .................. | 148/DIG. 17 |
| 5,306,667 A | * | 4/1994 | Shappir .................. | 438/233 |
| 5,338,697 A | * | 8/1994 | Aoki et al. .................. | 438/291 |
| 5,665,616 A | * | 9/1997 | Kimura et al. .................. | 438/234 |
| 5,668,025 A | * | 9/1997 | Blanchard .................. | 438/207 |
| 5,950,082 A | * | 9/1999 | Gardner .................. | 438/152 |
| 6,190,179 B1 | * | 2/2001 | Sundaresan .................. | 438/299 |

* cited by examiner

Primary Examiner—Steven Loke
Assistant Examiner—Samuel A Gebremariam
(74) Attorney, Agent, or Firm—Matthew D. Rabdou; David C. Ripma; Scott C. Krieger

(57) ABSTRACT

A CMOS transistor is formed on a single crystal silicon substrate. Active regions are formed on the substrate, including an nMOST active region and a pMOST active region. An epitaxial layer of undoped silicon is formed over the active regions. Out-diffusion from the underlying active regions produces dopant densities within the epitaxial layer one, or more, orders of magnitude lower than dopant densities within the underlying active regions. In a preferred embodiment, the epitaxial layer is counter doped by implanting ions of the opposite type to those within the underlying active region. Counter doping further reduces the dopant density, to reduce the threshold voltage further.

24 Claims, 4 Drawing Sheets

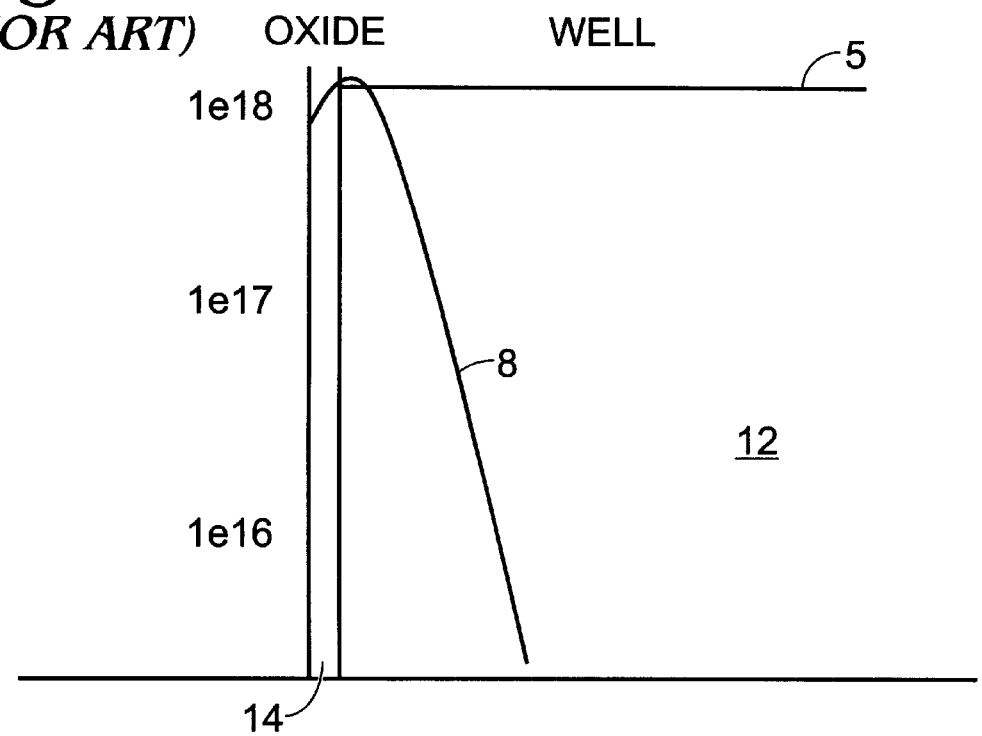
Fig. 1 *(PRIOR ART)*
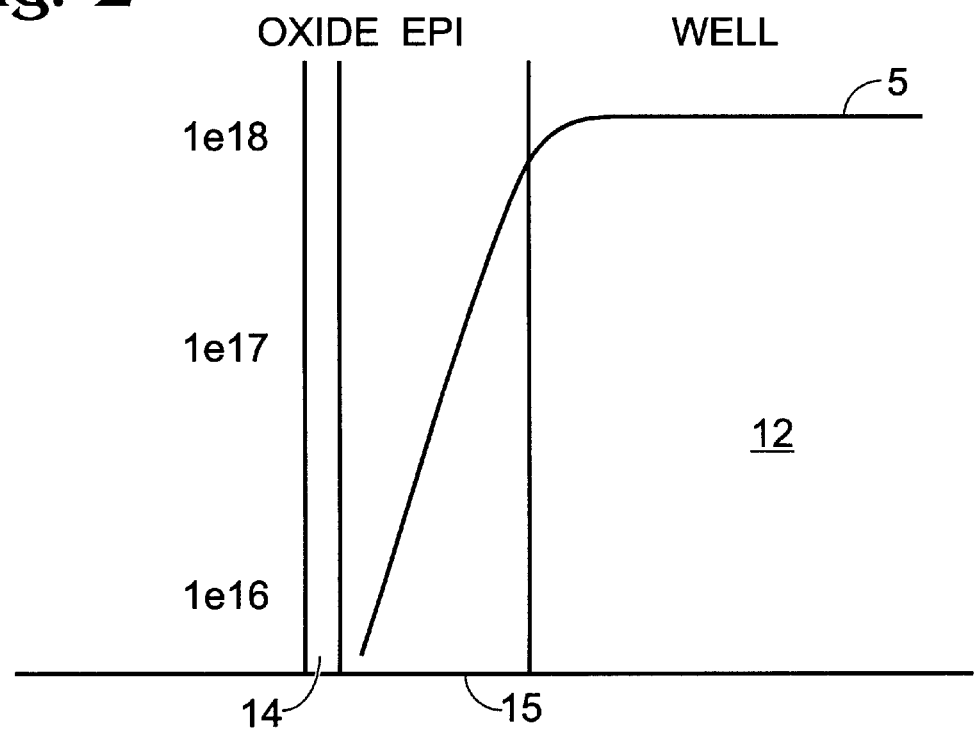
Fig. 2

METHOD OF FORMING CMOS TRANSISTOR HAVING A DEEP SUB-MICRON MID-GAP METAL GATE

BACKGROUND OF THE INVENTION

The invention relates to CMOS semiconductor devices and fabrication methods therefor, and specifically to a CMOS transistor having a deep sub-micron mid-gap metal gate, which is provided to adjust threshold voltage.

The device and method of manufacture disclosed herein resolves the threshold voltage adjustment problem. The conventional process for adjusting the threshold voltage is by low energy ion implantation into an n-well. The n-well is normally doped to the order of $1 \cdot 10^{17}$ cm$^{-3}$ to $5 \cdot 10^{18}$ cm$^{-3}$ for the state-of-the-art CMOS devices. As depicted in FIG. 1, the initial doping density is shown by line 5. The low energy implanted dopant distribution, to the first order, may be assumed as Gaussian distribution. Therefore the net doping near the surface is:

$$N(x) = N_D - N_{AM} \exp\left(-\frac{x - x_0}{\Delta x}\right)^2 \qquad (1)$$

Where $N_D$ is the donor density of the n-well, $N_{AM}$ is the maximum density of the implanted acceptors, $x_0$ is the projected implant depth and the $\Delta x$ is the Gaussian distribution constant. Both $N_{AM}$ and $N_D$ are large numbers. This makes control of the doping density very difficult. The doping density at the transition region from well to surface layer is the Gaussian tail. As depicted in FIG. 1, implant dopant density, shown by line 8, decreases sharply in the well area 12 when implanted through the thin surface oxide layer 14.

It is very difficult to control the threshold voltage using this prior art method on the smaller geometries required by current design constraints. For example, if the desired dopant density at the surface is $1 \cdot 10^{16}$ cm$^{-3}$ and the initial dopant density is $1 \cdot 10^{18}$ cm$^{-3}$, the implant dopant density will need to be on the order of $1 \cdot 10^{18}$ cm$^{-3}$ plus $1 \cdot 10^{16}$ cm$^{-3}$. This amounts to being able to know the initial dopant density to within 1% and also to control the implant dopant density to with 1% as well. This is extremely difficult. Even if the dopant density is to be reduced to a level 10% below the initial dopant density, the process tolerances will make it difficult to achieve with any precision.

The prior art process has been used for pMOST threshold voltage adjustment in n$^+$ polysilicon gate CMOS technology. The channel doping of an n$^+$ polysilicon gate nMOST is of the p-type. The channel doping of an n$^+$ polysilicon gate pMOST is of the n-type, having a shallow p-type surface layer. In the case of sub-micron CMOS devices, the surface p-type layer is too shallow to function properly. One solution to this problem is to change the gate electrode of pMOST devices to p$^+$ polysilicon. This eliminates the surface p-type layer. Although the threshold voltage is resolved, the gate depletion and high gate electrode resistance remain. Boron may diffuse through the gate oxide, causing variations in threshold voltage. These problems may be eliminated by replacing the polysilicon region at the gate with metal. The result is a metal gate CMOS structure.

The work function of mid-gap metal gate is about 0.5V lower than that of an n$^+$ polysilicon gate. Therefore, the channel doping density of metal gate transistors is very small compared to that of an n+or p+polysilicon gate device. The channel doping for a threshold voltage of 0.4 V is less than $1.0 \times 10^{17}$/cm$^3$. If this doping density is used to fabricate sub-micron devices, the channel will punch through at a very small drain voltage. Therefore, nMOST and pMOST devices require a very shallow surface p-layer and n-layer, respectively. However, when meeting the criteria to form a layer of appropriate thickness, the depth of these surface layers is so shallow, e.g., 10 nm to 30 nm, that conventional manufacturing processes lack adequate control to form a uniform layer having a desired threshold voltage.

SUMMARY OF THE INVENTION

A CMOS transistor structure is formed on a silicon substrate doped to form a active regions. Active regions are formed on the substrate by doping to a predetermined conductivity type, for example n-type or p-type. A thin layer of epitaxial silicon is overlies each of the active regions such that out-diffusion from the underlying active region dopes the epitaxial silicon. In a preferred embodiment, the thin layer of epitaxial silicon comprises additional dopants. Preferably, the additional dopants may be of the opposite conductivity type of the underlying active region, also referred to as counter dopants. Alternatively, the additional dopants may be of the same conductivity type as the underlying active region.

A method of forming a CMOS transistor on a silicon substrate comprises forming active regions by doping with a predetermined conductivity type, for example n-type or p-type, to a desired doping level; and growing a thin epitaxial layer of undoped silicon over each active region such that out-diffusion of the dopants in the underlying well dopes the epitaxial layer to adjust the threshold voltage. The presence of the epitaxial layer serves to lower the threshold voltage of the underlying active region. In a preferred embodiment additional dopants are implanted into the epitaxial layer to further control the threshold voltage, by changing the doping concentration within the epitaxial layer. Preferably, ions of the opposite conductivity type as compared to the underlying active region, are implanted by ultra-shallow ion implantation. Implanting ions of the opposite conductivity type is also referred to as counter doping. This further reduces the threshold voltage. In another embodiment ions of the same conductivity type as the underlying active region are implanted by ultra-shallow ion implantation. This increases the threshold voltage to a level above associated with the out-diffused epitaxial layer, but typically below the level associate with the underlying active region.

A method of forming a CMOS transistor on a silicon substrate, comprising the steps of: depositing a silicon dioxide layer and a silicon nitride layer overlying a silicon substrate; isolating active regions by shallow trench isolation; etching away the silicon nitride layer to expose the underlying silicon dioxide layer; forming an n-well and a p-well within separate active regions by implanting ions; removing the silicon dioxide layer; growing a thin epitaxial layer of undoped silicon over each active region such that out-diffusion of the dopants in the underlying well dopes the epitaxial layer to adjust the threshold voltage; forming a gate structure, source regions and drain regions; and completing the transistor.

An advantage of the invention is to provide a cost effective method for manufacturing a mid-gap metal gate CMOS integrated circuit.

Another advantage of the invention is to provide a mid-gap metal gate CMOS integrated circuit which has a high current density.

A further advantage of the invention is to provide a simple method for controlling the threshold voltage in a mid-gap metal gate CMOS.

Another advantage of the invention is to use an undoped epi-silicon layer to control the threshold voltage in a mid-gap metal gate CMOS.

A further advantage of the invention is to provide addition threshold voltage control in the mid-gap metal gate CMOS by doping the undoped epi-silicon layer These and other advantages of the invention will become more fully apparent as the description which follows is read in conjunction with the drawings.

BRIEF DESCRIPTION OF THE DRAWINGS

FIG. 1 depicts dopant distribution in a prior art structure.

FIG. 2 depicts dopant distribution in a device following deposition of undoped epitaxial silicon and out-diffusion from the underlying well structure.

DETAILED DESCRIPTION OF THE INVENTION

Figure 3:
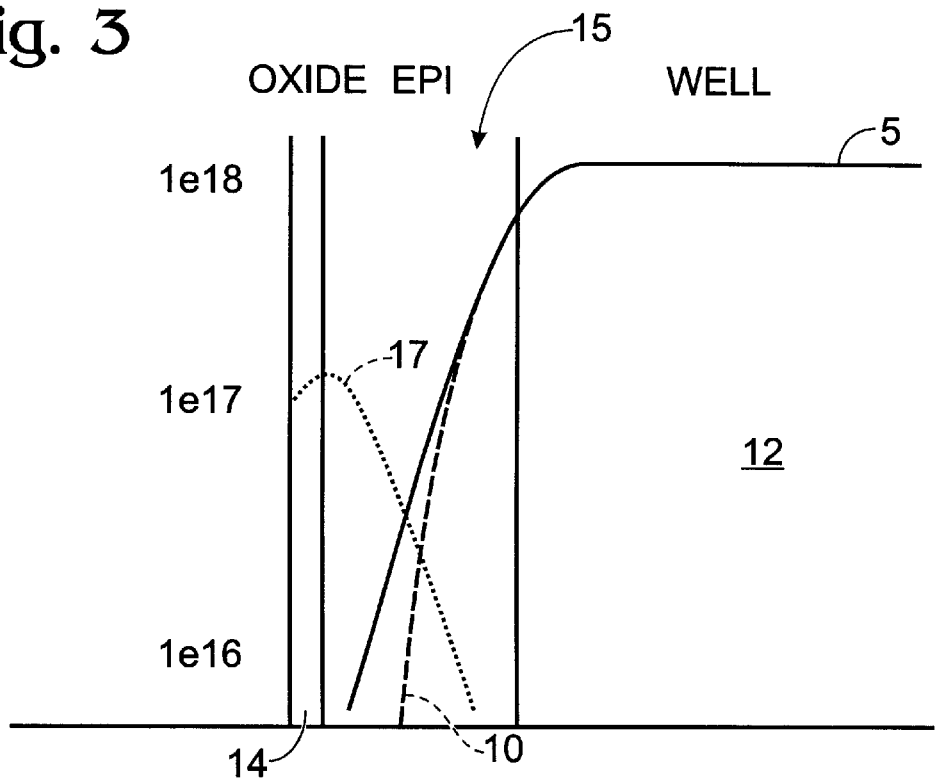
FIG. 3 depicts dopant distribution in a device following deposition of undoped epitaxial silicon, out-diffusion from the underlying well structure, and counter doping.

The present invention is a transistor structure with a channel region having dopant concentration selected to achieve a desired threshold voltage and a method for controlling that dopant concentration, and accordingly determining the threshold voltage.

The threshold voltage of a MOS transistor is given by:

$$V_T = V_{FB} + 2\phi_F + \frac{Q_B}{C_{OX}} \quad (2)$$

Where $V_{FB}$ is the flat band voltage, $\phi_F$ is the Fermi voltage of the channel silicon $Q_B$ is the fixed charge in the surface depletion layer and $C_{OX}$ is the gate dielectric capacitance. The flat band voltage is determined by the Fermi energies of the gate electrode material and the channel doping. The Fermi voltage is determined by the channel doping. Which in turn determines by the punch-through voltage of the device. Therefore, these parameters depend on the channel length and are suitably adjusted to reduce the threshold voltage.

Adding a sheet charge under the gate oxide can reduce the threshold voltage. Assume that the sheet charge is a positive charge and is equal to the acceptor density with an effective width of $\partial x$, in the n-channel region. The threshold voltage becomes:

$$V_T = V_{FB} + 2\phi_F + \frac{Q_B - \partial x N_B}{C_{OX}} \quad (3)$$

Where we assumed that the width of the surface depletion region is not effected by the placement of the positive charge. The threshold voltage is reduced by:

$$\Delta V_T = -\frac{\partial x N_B}{C_{OX}} \quad (4)$$

This can be accomplished by placing a thin epitaxial layer of undoped silicon beneath the gate oxide of both nMOST and pMOST devices. This is similar to the shallow surface p-type channel of $n^+$ polysilicon gate pMOST, except that this layer is initially undoped. The same is true for pMOST devices.

As an example for a channel doping density of $1 \times 10^{18}/cm^3$ and a gate oxide thickness of 2 nm, formation of a 1 Å thick undoped layer of silicon, also known as the epilayer, on the surface of the gate oxide corresponds to a 1 mV decrease in threshold voltage, if it is assumed that there is no out-diffusion of dopant to the epilayer. If the thickness of the undoped layer is 10 nm, the threshold voltage is reduced by about 0.1V, 0.5V for channel doping of $1 \cdot 10^{18}/cm^3$, $5 \cdot 10^{18}/cm^3$, respectively. This property may be used to adjust the threshold voltage of a mid gate metal gate CMOS.

As the channel length is reduced, the channel doping density is increased to prevent channel punch-through. As a result, the thickness of the surface undoped region is also reduced. Therefore, this process is scalable. The surface epitaxial silicon layer is very thin and will not cause punch through problem. After wafer processing, the doping out-diffuses to the surface epitaxial silicon layer. The amount of out-diffusion depends on the thermal budget. A lower thermal budget is preferred to provide as small an out-diffusion as possible.

The out-diffusion of the doping in the well causes the thin epitaxial silicon layer to be doped to the same polarity as that of the well. The doping density of the thin epitaxial layer decrease drastically away from the underlying well. The doping density in the epitaxial layer may be approximated by Gaussian distribution. Therefore, and referring back to Eq. 1, the net doping density of the epitaxial layer is approximately given by:

$$N(x) = N_D \exp\left[-\left(\frac{x - x_{EPI}}{\Delta x_1}\right)^2\right] - N_{AM} \exp\left[-\left(\frac{x - x_0}{\Delta x_2}\right)^2\right] \quad (5)$$

Since $x_0$ is very small, the net doping is further approximated by:

$$N(x) = N_D \exp\left[-\left(\frac{x - x_{EPI}}{\Delta x_1}\right)^2\right] - N_{am} \exp\left[-\left(\frac{x}{\Delta x_2}\right)^2\right] \quad (6)$$

The first term at the right-hand side of Eq. (6) is very small at surface, i.e., where x=0.

Referring now to FIG. 2, which depicts dopant distribution in a device following deposition of undoped epitaxial silicon and out-diffusion from the underlying well structure. Dopant density, shown by line 5, decreases by a factor of 100 to 1000, or more, from the well area 12 to the opposite edge of an epitaxial layer 15, also referred to as an epilayer 15. The out-diffusion into epilayer 15 provides a means of lowering the threshold voltage, by lowering the dopant density without counter doping the well area, which is difficult to control as discussed above.

Referring now to FIG. 3, the dopant density, and the corresponding threshold voltage, can be reduced further by counter doping epilayer 15. Counter doping refers to doping the epilayer by implanting dopants of the opposite conductivity type to the conductivity type of dopants in the underlying well. For example, to counter dope the epilayer 15 over an n-well, a p-type dopant, such as boron, is implanted. A resultant dopant density, shown by dashed-line 10, is achieved by counter doping the initial doping density, shown by line 5, with a counter dopant density, shown by line 17.

The counter doping may be done by either solid source diffusion and gas source diffusion. Both solid source and gas source diffusion have the doping distribution as of the last term of Eq. 6. Therefore, the doping density of the epitaxial layer near the top surface is virtually controlled only by the low energy counter doping ion implantation. The control of the surface layer doping density is relatively easy, because the amount of counter dopant density is of a similar order of magnitude to the initial dopant density within the epitaxial layer and a desired final dopant density. In addition the transition region between the well and the surface channel is the differential of the two Gaussian distributions. Therefore, a steeper transition region may be fabricated. The control is relatively easy compared to that of the known, state-of-the-art processes. For example, if the peak net doping of the surface layer is one order of magnitude lower than the well doping density, a 5% decrease in well doping and a 5% increase in counter doping ion implantation dose do not produce a surface layer when using conventional fabrication processes. The same deviation of doping, using the method of the invention, reduced the peak doping density of the surface layer by about 5%. The ions are implanted through a thin layer of oxide in order to reduce the depth of ion penetration.

Figure 4:
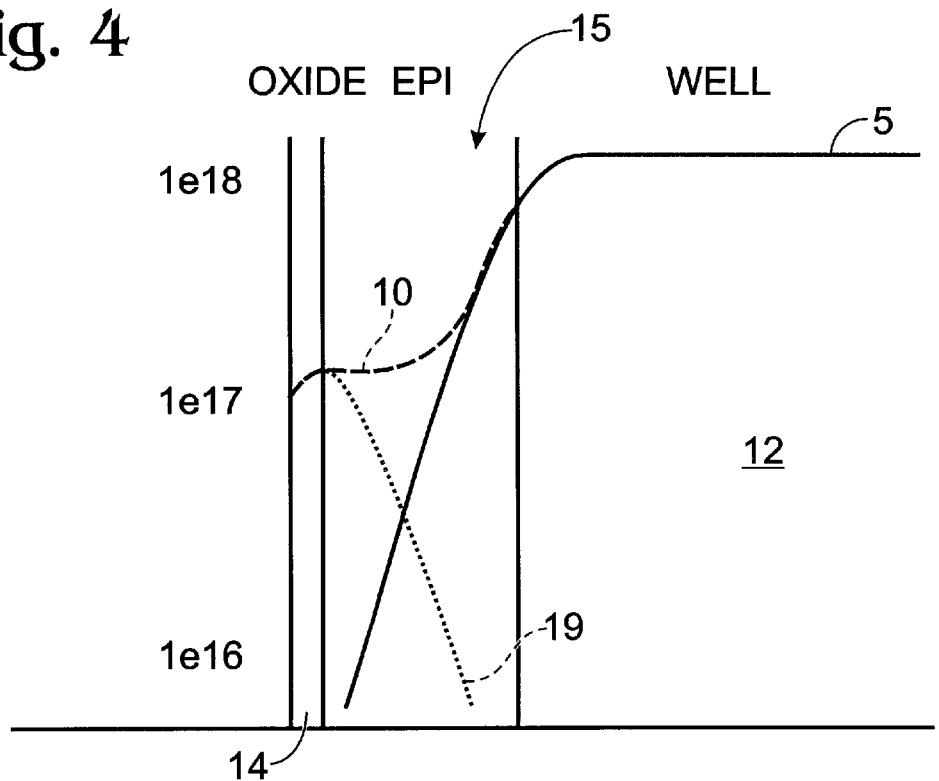
FIG. 4 depicts dopant distribution in a device following deposition of undoped epitaxial silicon, out-diffusion from the underlying well structure, and additional doping.

It is also within the scope of the present invention, to increase the doping concentration within the epilayer. It may be desirable to produce a device with a doping concentration higher than that achieved by the out-diffusion from the underlying well, but typically less than the dopant concentration of the well. This is accomplished by additional doping with a dopant of the same conductivity type as the underlying well. For example, arsenic or phosphorous could be implanted into the epilayer overlying an n-well. Referring to FIG. 4, a resultant dopant density, shown by line 10, is achieved by additional doping, shown by line 19, of the initial dopant density, shown by line 5.

Figure 5:
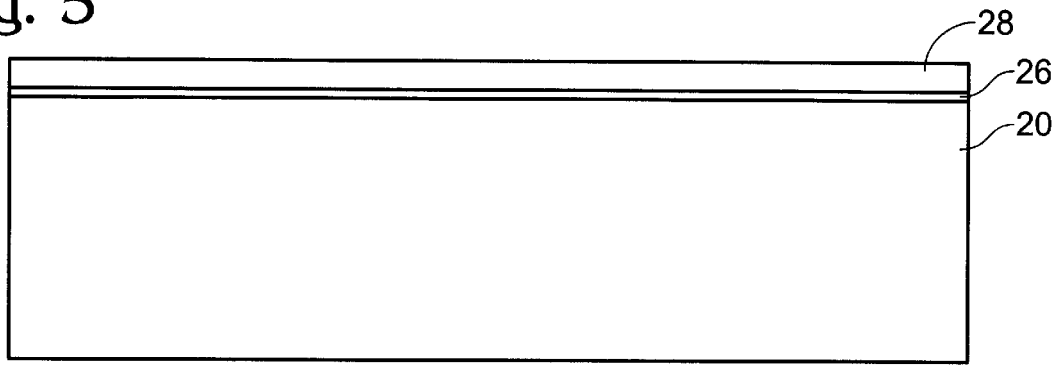
FIG. 5 depicts formation of the device following a deposition of oxide and nitride.

A transistor device is provided with a controlled dopant density, and threshold voltage, along with a method for controlling the dopant density, and threshold voltage. Referring now to FIG. 5, a CMOS transistor device under construction according to the invention is shown. An oxide layer 26 is deposited over a silicon substrate 20. Oxide layer 26 is formed by growing silicon dioxide, also referred to as oxide, on substrate 20 to a thickness of between about 10 nm and 50 nm. A nitride layer 28 is deposited over substrate 20 by chemical vapor deposition (CVD) to a thickness of about 30 nm to 100 nm.

Figure 6:
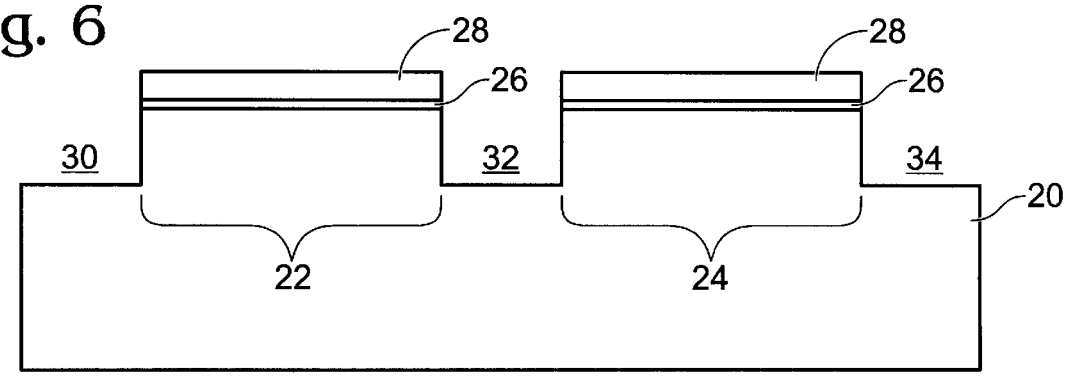
FIG. 6 depicts formation of shallow trench isolation.

Referring now to FIG. 6, substrate 20 is processed to form a pair of active regions 22, 24, also referred to herein as device areas, which will preferably have characteristics of a pMOST region and an nMOST region, respectively. The structure is masked, and trenches 30, 32 and 34 are formed. The formation of these trenches is also known as shallow trench isolation (STI). The trenches extend through nitride layer 28, oxide layer 26 and partially through substrate 20.

The depth of the trenches in substrate 20 is between about 400 nm and 1000 nm. Silicon oxide is deposited by CVD, filling trenches 30, 32 and 34, and covering the structure. The CVD process deposits oxide to a thickness of 1000 nm to 2000 nm. The structure is next chemically mechanically polished (CMP), which polishing stops at the nitride layer 28.

Following CMP the nitride layer 28 is removed leaving oxide insulation regions 36, 38 and 40 which surround the active regions 22 and 24. In a preferred embodiment, an n-well 42 and a p-well 44 are formed in active regions 22, 24, respectively. It will be understood by those of skill in the art that the silicon substrate is treated to prepare a p-well or an n-well by doping with impurities, thereby forming a conductive channel, which will ultimately form the gate of a CMOS transistor, and to have the threshold voltage adjustments suitable for fabrication of the device of the invention. For instance, n-well 42 may be formed by phosphorus implantation at an energy level of 100 keV to 400 keV, and a dose of $1.0 \cdot 10^{12}$ $cm^{-2}$ to $1.0 \cdot 10^{14}$ $cm^{-2}$, followed by thermal diffusion, resulting in a phosphorous ion concentration in a range between $1 \cdot 10^{16}$ $cm^{-3}$ to $5 \cdot 10^{18}$ $cm^{-3}$. The p-well 44 may be formed by single boron ion implantation at an energy level of 30 keV to 80 keV and a dose of $1.0 \cdot 10^{12}$ $cm^{-2}$ to $1.0 \cdot 10^{14}$ $cm^{-2}$, followed by thermal diffusion, resulting in a boron ion concentration in a range between $1 \cdot 10^{16}$ $cm^{-3}$ to $5 \cdot 10^{18}$ $cm^{-3}$. Alternately, the p-well and the n-well may be formed by multiple ion implantations, followed by thermal diffusion. N-well and p-well formation may be performed on substrate 20 prior to the steps described thus far, if desired.

Figure 7:
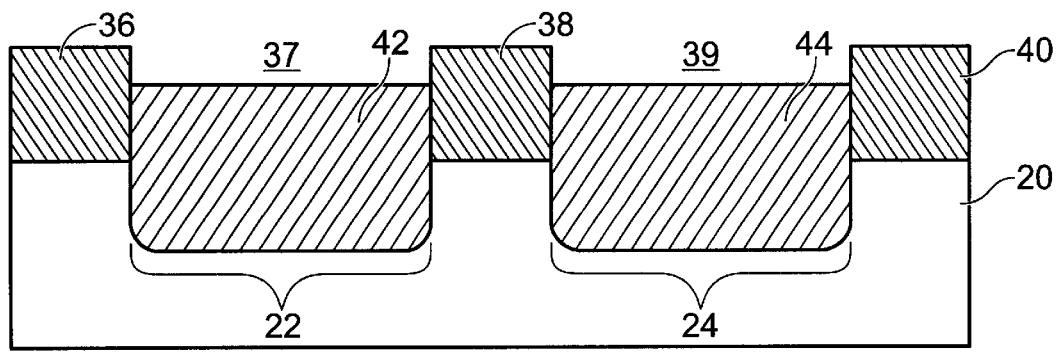
FIG. 7 depicts formation of the device following oxide deposition, CMP, and formation of wells.

In a preferred embodiment, oxide layer 26 is etched after formation of the n-well and p-well. It is also possible to remove the oxide layer 26 after removal of nitride layer 28 prior to formation of the n-well and p-well. Once the nitride layer 28 and the oxide layer 26 are removed, extremely shallow trenches 37 and 39 are left over the active regions 22 and 24, which are isolated by oxide insulation regions 36, 38 and 40 as shown in FIG. 7.

Figure 8:
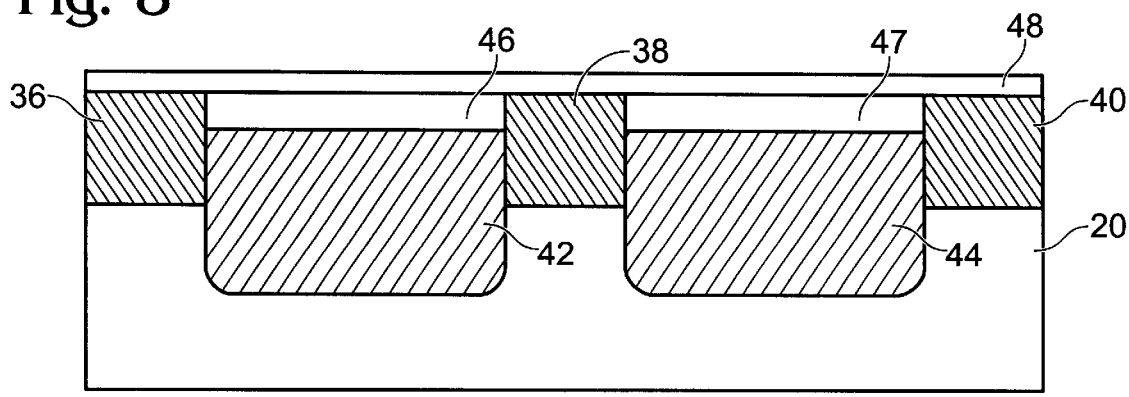
FIG. 8 depicts formation of the device after deposition of epitaxial silicon, and an oxide layer.

Referring now to FIG. 8, an undoped layer 46 of silicon is formed to a thickness of about 10 nm to about 100 nm. Undoped regions 46 and 47 are formed by selective epitaxial growth of undoped silicon, in the preferred embodiment. In another embodiment, undoped layer 46 is formed by non-selective deposition. Non-selective deposition methods produce polysilicon over insulation regions 36, 38, and 40, The polysilicon then needs to be removed by CMP or other method. Although undoped material is deposited to form regions 46 and 47, during formation of undoped regions 46 and 47 out-diffusion of dopants from the underlying n-well 42 and p-well 44 introduces dopants to undoped regions 46 and 47. The resulting dopant concentration within regions 46 and 47 is 10 to 100+ times lower than the well dopant concentration within the well regions 42 and 44. Preferably the dopant concentration at the edge of the undoped regions 46 and 47 is between $1 \cdot 10^{15}$ $cm^{-3}$ to $5 \cdot 10^{17}$ $cm^{-3}$.

Layer 46 is preferably treated to form an oxide layer 48 of 5 nm to 20 nm thickness, by low temperature thermal oxidation, or by additional CVD of oxide.

To provide further control of the dopant density, and the corresponding threshold voltage, further dopants are implanted into the undoped regions 46 and 47. The additional dopants can be counter dopants, to reduce the overall dopant concentration, or additional dopants of the same conductivity type as the underlying well.

For example to counter dope the epilayer over a p-well, the n-well 42 is masked so that low energy arsenic (As), or phosphorous (P), ultra-shallow surface ion implantation may take place in p-well 44. Arsenic (As), or phosphorous (P), ions are implanted at an energy of between about 2 keV and 60 keV, at a dose of about $5 \cdot 10^{10}$ cm$^{-2}$ to $5 \cdot 10^{11}$ cm$^{-2}$. Then n-well 42 is unmasked and p-well 44 is masked so that low energy BF$_2$ ions may be implanted in n-well 42, which is also an ultra-shallow surface ion implantation step. BF$_2$ ions are implanted at an energy of about 1 keV to 50 keV, at a dose of about $5 \cdot 10^{10}$ cm$^{-2}$ to $5 \cdot 10^{11}$ cm$^{-2}$. In both instances, the ions are implanted through the surface oxide layer into the epilayer.

Although it is generally desirable to counter dope to reduce threshold voltage, in some applications it may be necessary to add additional dopants of the same conductivity type as the well dopants to increase threshold voltage above that produced by out-diffusion alone. Accordingly, the n-well 42 is masked so that low energy BF$_2$ ultra-shallow surface ion implantation may take place in p-well 44. BF$_2$ ions are implanted at an energy of between about 1 keV and 50 keV, at a dose of about $5 \cdot 10^{10}$ cm$^{-2}$ to $5 \cdot 10^{11}$ cm$^{-2}$. Then n-well 42 is unmasked and p-well 44 is masked so that low energy phosphorous (P) ions may be implanted in n-well 42, which is also an ultra-shallow surface ion implantation step. Phosphorous ions are implanted at an energy of about 2 keV to 60 keV, at a dose of about $5 \cdot 10^{10}$ cm$^{-2}$ to $5 \cdot 10^{11}$ cm$^{-2}$. In both instances, the ions are implanted through the surface oxide layer into the epilayer.

Figure 9:
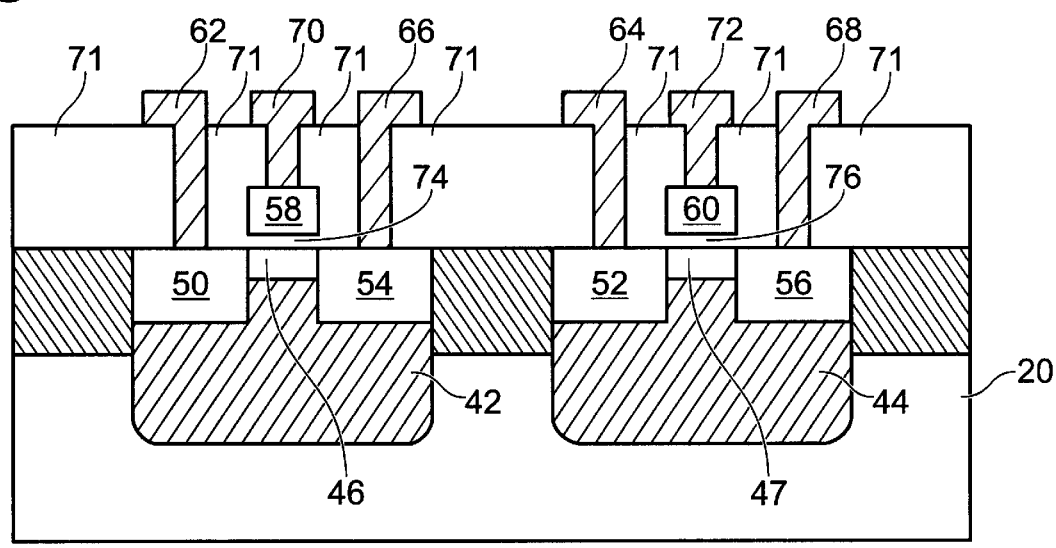
FIG. 9 depicts the completed device.

Referring now to the completed device shown in FIG. 9, a thin layer of SiN$_x$, or polysilicon, of a thickness between 100 nm to 300 nm, is deposited and etched to form a sacrificial gate electrode. Appropriate ions are implanted to form source regions 50, 52, and drain regions 54, 56. The source and drain regions are referred to herein as conductive channels of a second type, which are n+channels and p+channels for nMOST devices and pMOST devices, respectively, and the impurities implanted in the substrate are referred to doping impurities of a second type. By way of example, the LDD of an nMOST device may be done by phosphorous (P) or arsenic (As) ion implantation at an energy no higher than 50 keV (P) or 100 keV (As), and a dose of between $1.0 \cdot 10^{13}$ cm$^{-2}$ to $5.0 \cdot 10^{14}$ cm$^{-2}$. The n$^+$ layer may be formed by As ion implantation at an energy level of between 10 keV and 80 keV, at a does of between $1.0 \cdot 10^{15}$ cm$^{-2}$ to $5.0 \cdot 10^{15}$ cm$^{-2}$. The LDD of a pMOST device may be done by boron (B or BF$_2$) ion implantation at an energy no higher than 20 keV (B) or 100 keV (BF$_2$), and a dose of between $1.0 \cdot 10^{13}$ cm$^{-2}$ to $5.0 \cdot 10^{14}$ cm$^{-2}$. The p$^+$ layer may be formed by BF$_2$ ion implantation at an energy level of between 10 keV and 80 keV, at a does of between $1.0 \cdot 10^{15}$ cm$^{-2}$ to $5.0 \cdot 10^{15}$ cm$^{-2}$.

Metal gates 58, 60 are formed by any state-of-the-art process, such as damascene metal and a metal etching process.

Once ion implantation in the source and drain regions is complete, a layer of passivation oxide 71 is deposited, and the implanted ions are activated by heat treatment, along with dielectric densification.

The structure is covered with photoresist followed by trenching to form electrode-receiving structures for source, gate and drain electrodes. Metallization results in the formation of source electrodes 62, 64, drain electrodes 66, 68 and epitaxial layers 46, 47, respectively. An oxide gap, or gate dielectric region, 74, 76 is located between gates 58, 60 and gate electrodes 70, 72, respectively. Gate oxidation includes the use of a high-k dielectric, such as TiO$_2$, ZrO$_2$ or Al$_3$O$_5$. The effective thickness of the gate dielectric is equivalent to the thickness of the silicon oxide layer, which is about 1 nm to 3 nm. It will be appreciated that the drawings are not to scale for these very thin regions.

Thus, a mid-gap metal gate CMOS transistor, and a method of controlling the threshold voltage thereof have been described. The integrated circuit formed hereby is characterized by a high drive current. The structure is simple and is a cost-effective method for forming the metal gate sub-micron CMOS transistor.

Although a preferred embodiment has been described, it will be appreciated that further variations and modifications may be made thereto without departing from the scope of the invention as defined in the appended claims.

What is claimed is:

1. A method of forming a CMOS transistor structure on a silicon substrate, comprising the steps of:
    a) forming active regions on a silicon substrate by doping with dopants of a predetermined conductivity type to a desired doping level,
    b) growing a thin epitaxial layer of undoped silicon over each active region such that out-diffusion of the dopants in the underlying active regions dopes the epitaxial layer to adjust the threshold voltage; and
    c) implanting ions into the epitaxial layer to further control the threshold voltage.

2. The method of claim 1, wherein the active region is an n-well formed by implanting phosphorous, or arsenic ions in a pMOST region at an energy level of between about 100 keV to 400 keV and at a dose of between about $1.0 \cdot 10^{12}$ cm$^{-2}$ to $1.0 \cdot 10^{14}$ cm$^{-2}$.

3. The method of claim 1 wherein the active region is a p-well formed by implanting boron ions in an nMOST region at an energy level of between about 30 keV to 80 keV and at a dose of between about $1.0 \cdot 10^{12}$ cm$^{-2}$ to $1.0 \cdot 10^{14}$ cm$^{-2}$.

4. The method of claim 1, wherein the thin epitaxial layer of silicon is grown to a thickness of between about 10 nm to 100 nm.

5. The method of claim 1, wherein the step of implanting ions into the epitaxial layer is accomplished by implanting BF$_2$ ions into the epitaxial layer at an energy level of between about 2 keV and 60 keV at a dose of between about $5.0 \cdot 10^{10}$ cm$^{-2}$ and $5.0 \cdot 10^{11}$ cm$^{-2}$.

6. The method of claim 1, wherein the step of implanting ions into the epitaxial layer is accomplished by implanting phosphorous, or arsenic, ions into the epitaxial layer at an energy level of between about 1 keV and 50 keV at a dose of between about $5.0 \cdot 10^{10}$ cm$^{-2}$ and $5.0 \cdot 10^{11}$ cm$^{-2}$.

7. A method of forming a CMOS transistor structure on a silicon substrate, comprising the steps of:
    a) forming active regions on a silicon substrate by forming n-well and p-well regions; and
    b) growing a thin epitaxial layer of undoped silicon over each active region such that out-diffusion of the dopants in the underlying well dopes the epitaxial layer to adjust the threshold voltage, wherein additional ions are implanted into the epitaxial layer.

8. The method of claim 7, wherein the n-well region is formed by implanting phosphorous, or arsenic, ions in a pMOST region at an energy level of between about 100 keV to 400 keV and at a dose of between about $1.0 \cdot 10^{12}$ cm$^{-2}$ to $1.0 \cdot 10^{14}$ cm$^{-2}$.

9. The method of claim 7, wherein the additional ions are counter dopants.

10. The method of claim 9, wherein the step of implanting ions into the epitaxial layer is accomplished by implanting BF$_2$ ions into the epitaxial layer at an energy level of between about 2 keV and 60 keV at a dose of between about $5.0 \cdot 10^{10}$ cm$^{-2}$ and $5.0 \cdot 10^{11}$ cm$^{-2}$.

11. The method of claim 7, wherein the additional ions are of the same conductivity type as the underlying n-well region.

12. The method of claim 11, wherein the step of implanting ions into the epitaxial layer is accomplished by implanting phosphorous, or arsenic, ions into the epitaxial layer at an energy level of between about 1 keV and 50 keV at a dose of between about $5.0 \cdot 10^{10}$ cm$^{-2}$ and $5.0 \cdot 10^{11}$ cm$^{-2}$.

13. The method of claim 7, wherein the p-well region is formed by implanting boron ions in an nMOST region at an energy level of between about 30 keV to 80 keV and at a dose of between about $1.0 \cdot 10^{12}$ cm$^{-2}$ to $1.0 \cdot 10^{14}$ cm$^{-2}$.

14. The method of claim 7, wherein the additional ions are counter dopants.

15. The method of claim 14, wherein the step of implanting ions into the epitaxial layer is accomplished by implanting phosphorous, or arsenic, ions into the epitaxial layer at an energy level of between about 1 keV and 50 keV at a dose of between about $5.0 \cdot 10^{10}$ cm$^{-2}$ and $5.0 \cdot 10^{11}$ cm$^{-2}$.

16. The method of claim 7, wherein the additional ions are of the same conductivity type as the underlying p-well region.

17. The method of claim 16, wherein the step of implanting ions into the epitaxial layer is accomplished by implanting BF$_2$ ions into the epitaxial layer at an energy level of between about 2 keV and 60 keV at a dose of between about $5.0 \cdot 10^{10}$ cm$^{-2}$ and $5.0 \cdot 10^{11}$ cm$^{-2}$.

18. A method of forming a CMOS transistor on a silicon substrate, comprising the steps of:
    a) depositing a silicon dioxide layer and a silicon nitride layer overlying a silicon substrate;
    b) isolating active regions by shallow trench isolation;
    c) etching away the silicon nitride layer to expose the underlying silicon dioxide layer;
    d) forming an n-well and a p-well within separate active regions by implanting ions;
    e) removing the silicon dioxide layer;
    f) growing a thin epitaxial layer of undoped silicon over each active region such that out-diffusion of the dopants in the underlying well dopes the epitaxial layer to adjust the threshold voltage;
    g) forming a layer of oxide overlying the thin epitaxial layer;
    h) implanting dopants through the oxide layer into the thin epitaxial layer;
    i) forming a gate structure, source regions and drain regions; and
    j) completing the transistor.

19. A method of forming a CMOS transistor structure on a silicon substrate, comprising the steps of:
    a) forming active regions on a silicon substrate by forming n-well and p-well regions; and
    b) growing a thin epitaxial layer of undoped silicon over each active region such that out-diffusion of the dopants in the underlying well dopes the epitaxial layer to adjust the threshold voltage, wherein additional ions are implanted into the epitaxial layer, wherein the additional ions are counter dopants.

20. The method of claim 19, wherein the step of implanting ions into the epitaxial layer is accomplished by implanting phosphorous, or arsenic, ions into the epitaxial layer at an energy level of between about 1 keV and 50 keV at a dose of between about $5.0 \cdot 10^{10}$ cm$^{-2}$ and $5.0 \cdot 10^{11}$ cm$^{-2}$.

21. A method of forming a CMOS transistor structure on a silicon substrate, comprising the steps of:
    a) forming active regions on a silicon substrate by forming n-well and p-well regions; and
    b) growing a thin epitaxial layer of undoped silicon over each active region such that out-diffusion of the dopants in the underlying well dopes the epitaxial layer to adjust the threshold voltage, wherein additional ions are implanted into the epitaxial layer, wherein the additional ions are of the same conductivity type as the underlying p-well region.

22. The method of claim 21, wherein the step of implanting ions into the epitaxial layer is accomplished by implanting BF$_2$ ions into the epitaxial layer at an energy level of between about 2 keV and 60 keV at a dose of between about $5.0 \cdot 10^{10}$ cm$^{-2}$ and $5.0 \cdot 10^{11}$ cm$^{-2}$.

23. The method of claim 1, further comprising forming a layer of silicon dioxide prior to implanting ions.

24. The method of claim 7, further comprising forming a layer of silicon dioxide prior to implanting additional ions.

* * * * *